United States Patent [19]

Sakuyama et al.

[11] Patent Number: 5,861,975
[45] Date of Patent: Jan. 19, 1999

[54] WAVELENGTH STABILITY CIRCUIT

[75] Inventors: Hiroshi Sakuyama; Shohei Yamaguchi, both of Tokyo, Japan

[73] Assignee: NEC Corporation, Tokyo, Japan

[21] Appl. No.: 719,979

[22] Filed: Sep. 24, 1996

[30] Foreign Application Priority Data

Sep. 27, 1995 [JP] Japan ................................. 7-248197

[51] Int. Cl.$^6$ .......................... H04B 10/145; H04B 10/04
[52] U.S. Cl. ........................................ 359/187; 359/191
[58] Field of Search ................................. 359/124, 133, 359/134, 161, 187, 191

[56] References Cited

U.S. PATENT DOCUMENTS

| | | | |
|---|---|---|---|
| 5,146,358 | 9/1992 | Brooks | 359/181 |
| 5,365,361 | 11/1994 | Noll et al. | 359/111 |
| 5,546,210 | 8/1996 | Chaplyvy et al. | 359/161 |
| 5,570,182 | 10/1996 | Nathel et al. | 356/345 |
| 5,589,970 | 12/1996 | Lyu et al. | 359/110 |
| 5,663,822 | 9/1997 | Fee | 359/161 |

FOREIGN PATENT DOCUMENTS

| | | |
|---|---|---|
| 0352747 | 1/1989 | European Pat. Off. . |
| 2-228830 | 9/1990 | Japan . |
| 4-335724 | 11/1992 | Japan . |
| 2222481 | 3/1990 | United Kingdom . |
| 2293684 | 4/1996 | United Kingdom . |
| WO8701874 | 3/1987 | WIPO . |

Primary Examiner—Leslie Pascal
Attorney, Agent, or Firm—Sughrue, Mion, Zinn, Macpeak & Seas, PLLC

[57] ABSTRACT

It is the object of the invention to provide a wavelength stability circuit used in a WDM optical transmission system, in which the spacing of wavelengths between adjacent optical signals are always so controlled as to keep a prescribed value. The two optical signals with different wavelengths are respectively generated by two laser diodes and multiplexed by an optical coupler. A portion of the multiplexed optical signals is supplied to an optical heterodyne detection circuit, where the spacing of the wavelengths between the two optical signals is detected. The spacing of the wavelengths between the optical signals is converted into an electrical signal by an O/E converter and a frequency counter, and the electrical signal is compared with a standard voltage in a comparator. The spacing of the wavelengths between the two optical signals is always controlled and stabilized by a control circuit and keeps a prescribed value, where the lasing wavelength of one of the two laser diodes is controlled in accordance with the result of comparison of the comparator.

5 Claims, 2 Drawing Sheets

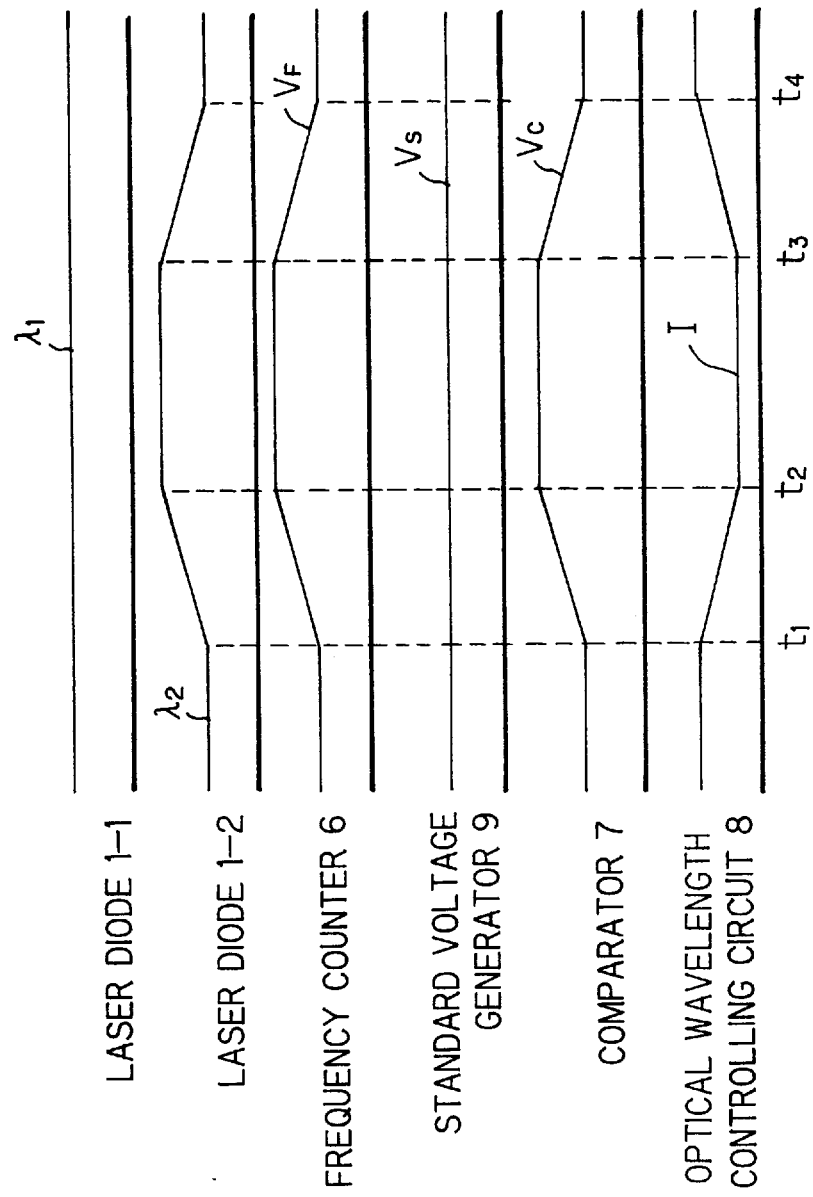

WAVELENGTH STABILITY CIRCUIT

FIELD OF THE INVENTION

The invention relates to a wavelength stability circuit, and especially to a wavelength stability circuit used in a wavelength division multiplexing (WDM, hereinafter) optical transmission system, in which plural optical signals with different wavelengths are multiplexed and transmitted through a common optical transmission line.

BACKGROUND OF THE INVENTION

In the WDM transmission system, cross talks must be prevented by keeping the spacing of wavelengths between adjacent optical signals constant, and technologies on this subject are disclosed on Japanese Patent Kokai Nos. 2-228830 and 4-335724. In these technologies, the absolute wavelengths of the optical signals are always kept constant by separately controlling the respective wavelengths of the optical signals.

In the conventionally proposed WDM optical transmission system, in which the plural optical signals with the different wavelengths are transmitted through the common optical fiber transmission line using the conventional wavelength stability circuits, the absolute wavelengths of the optical signals to be transmitted are controlled, but the spacing of the wavelengths between the adjacent optical signals are not controlled at all.

In situations where the spacing of the wavelengths between the adjacent optical signals becomes very small in order to increase the multiplexed density by increasing the number of the optical signals, it is necessary to decrease the cross talks between the optical signals by keeping the spacing of the wavelengths between the adjacent optical signals larger than a critical value.

However, since the absolute wavelengths of the optical signals are controlled in the aforementioned conventional technologies, the spacing of the wavelengths between adjacent optical signals can not become constant, so that the generation of the cross talks can not be suppressed.

SUMMARY OF THE INVENTION

Accordingly, it is an object of the invention to provide a wavelength stability circuit, by which the multiplexed density can be increased without generating the cross talks between the optical signals by always keeping the spacing of the wavelengths between the adjacent optical signals constant.

According to a feature of the invention, a wavelength stability circuit, comprises:

optical signal generating means, which respectively generates first and second optical signals with different wavelengths;

optical signal multiplexing means, which multiplexes the first and second optical signals;

wavelength difference detecting means, which detects a difference in wavelengths between the first and second optical signals by processing a portion of an output of the optical signal multiplexing means; and wavelength control means, which so controls a wavelength of one of the first and second optical signals such that the difference in wavelengths between the first and second optical signal is kept to a predetermined value.

In the wavelength stability circuit, the spacing of the wavelengths between the two optical signals can be detected by means of optical heterodyne detection, for example, with reference to one of the two optical signals, and the wavelength of the other optical signal is so controlled that the spacing of the wavelengths between the two optical signals is always kept constant.

BRIEF DESCRIPTION OF THE DRAWINGS

The invention will be explained in more detail in conjunction with the appended drawings, wherein:

FIG. 2 is a timing chart showing operation in the preferred embodiment.

DESCRIPTION OF THE PREFERRED EMBODIMENTS

Figure 1:
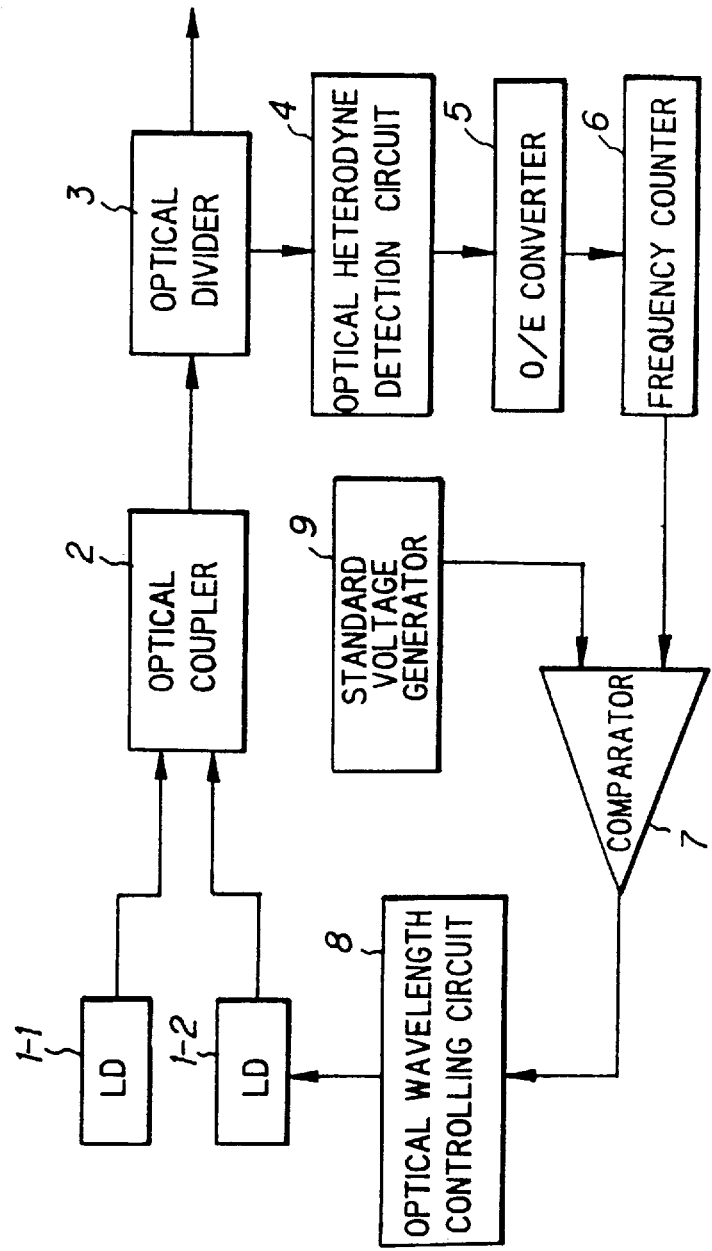
FIG. 1 is a block diagram showing a wavelength stability circuit in a preferred embodiment according to the invention.

Hereafter, the preferred embodiment of the invention will be explained in conjunction with the appended drawings.

FIG. 1 shows the block diagram of the preferred embodiment of the invention. In FIG. 1, laser diodes (LDs) 1-1 and 1-2, which serve as two sources, are so constructed that they generate two optical signals with different wavelengths, and both of the optical signals are multiplexed by an optical coupler 2, and a portion of the multiplexed optical signals is branched by an optical divider 3.

The portion of the multiplexed optical signals is supplied to an optical heterodyne detection circuit 4, where optical heterodyne detection is carried out with reference to one of the optical signals generated by the laser diodes 1-1 and 1-2 (the optical signal generated by the laser diode 1-1, in this case). By selectively deriving an optical signal corresponding to the difference between the wavelengths of the two optical signals, which is obtained by mixing these optical signals in the heterodyne detection circuit 4, the spacing of the wavelengths between both the optical signals can be obtained.

The spacing of the wavelengths between the two optical signals is converted into the difference of the frequencies therebetween by an O/E (optical/electrical) converter 5, and the difference of the frequencies is converted into a voltage by a frequency counter 6. A voltage thus obtained is compared in a comparator 7 with a standard voltage generated by a standard voltage generator 9, and the result of comparison is supplied to an optical wavelength controlling circuit 8.

In the optical wavelength controlling circuit 8, a control signal, which controls the lasing wavelength of the other one of the laser diodes 1-1 and 1-2 (the laser diode 1-2, in this case) is generated in accordance with the comparison result of comparator 7. By the above mentioned procedure, the spacing of the wavelengths between the two optical signals is always controlled to keep a constant value corresponding to the output voltage of the standard voltage generator 9.

Still more, the lasing wavelength of the laser diode can be controlled by well known methods, for example, controlling an injection current supplied to the laser diode and an ambient temperature thereof.

FIG. 2 shows operation in the wavelength stability circuit in the preferred embodiment. In operation, the laser diode 1-1 emits an optical signal of a wavelength $\lambda_1$, and the laser diode 1-2 emits an optical signal of a wavelength $\lambda_2$, so that a spacing $(\lambda_2-\lambda_1)$ of the wavelengths $\lambda_1$ and $\lambda_2$ is kept constant. At the timing $t_1$, the wavelength $\lambda_2$ of the optical signal emitted from the laser diode 1-2 is increased, so that an output voltage $V_r$ of the frequency counter 6 is increased.

As a result, an output voltage $V_C$ of the comparator 7 which is obtained in accordance with the comparison between the output voltage $V_F$ of the frequency counter 6 and the standard voltage $V_S$ of the standard voltage generator 9 is increased. Then, an injection current I supplied to the laser diode 1-2 is decreased in accordance with the control of the optical wavelength controlling circuit 8. Consequently, the increase of the wavelength $\lambda_2$ of the optical signal emitter from the laser diode 1-2 is stopped at the timing $t_2$. Thus, the output voltages $V_F$ and $V_C$ of the frequency counter 6 and the comparator 7 stop increasing, and the injection current I stops decreasing, respectively, at the same timing $t_2$. During a period of the timings $t_2$ to $t_3$, the increased wavelength $\lambda_2$, and output voltages $V_F$ and $V_C$ are constant, and the decreased injection current I is also constant. At the timing $t_3$, the increased wavelength $\lambda_2$ of the optical signal emitted from the laser diode 1-2 starts to decrease, so that the output voltages $V_F$ and $V_C$ of the frequency counter 6 and the comparator 7 start to decrease, thereby resulting in the stabilization of the spacing $(\lambda_2-\lambda_1)$ of the wavelengths $\lambda_1$ and $\lambda_2$ of the optical signals emitted from the laser diodes 1-1 and 1-2 at the timing $t_4$ in accordance with the increase of the decreased injection current I during the period of the timings $t_3$ to $t_4$ and the stabilization of the injection current I at the timing $t_4$ which are sequentially controlled by the optical wavelength controlling circuit 8.

In the preferred embodiment, even though only two optical signals are multiplexed, more than two optical signals may be multiplexed.

As mentioned above, according to the invention, since the spacing of the wavelengths between the adjacent optical signals to be transmitted are so controlled as to keep a predetermined constant value, a stable communication can be secured, and concern about cross talks can be eliminated, even when the multiplexed density is large.

Although the invention has been described with respect to specific embodiment for a complete and clear disclosure, the appended claims are not to be thus limited but are to be construed as embodying all modification and alternative constructions that may occur to one skilled in the art which fairly fall within the basic teaching set forth herein.

What is claimed is:

1. A wavelength stability circuit, comprising:

an optical signal generating means, which respectively generates first and second signals with different wavelengths; and, an optical signal multiplexing means, which multiplexes said first and second optical signals; and, a wavelength difference detecting means, which detects a difference in wavelengths between said first and second optical signals by processing a portion of an output of said optical signal multiplexing means, wherein said wavelength difference detecting means further comprises:

a means for optical heterodyne detection, which processes said portion of said output of said optical signal multiplexing means, where said first optical signal serves as a reference optical signal, and a means for converting said wavelength difference, which is obtained by said means for optical heterodyne detection, into a frequency difference; and, a wavelength control means, which so controls a wavelength of one of said first and second optical signals that said difference in wavelengths between first and second optical signals is kept to a predetermined value.

2. A wavelength stability circuit, according to claim 1, wherein:

said wavelength control means so controls a wavelength of said second optical signal that said wavelength difference, which is obtained by said means for optical heterodyne detection, is kept to be a constant value.

3. A wavelength stability circuit, according to claim 1, wherein said wavelength difference detecting means further comprises:

a means for comparing said frequency difference with a predetermined reference value.

4. A wavelength stability circuit, according to claim 3, wherein:

said means for converting comprises: means for converting said frequency difference into a voltage: and said means for comparing comprises means for comparing said voltage with a standard voltage.

5. A wavelength stability circuit, according to claim 4, wherein:

said wavelength control means is so constructed that said wavelength of said second optical signal is controlled in accordance with an output voltage of said means for comparing.

* * * * *